(12) United States Patent
Harada

(10) Patent No.: US 6,759,747 B2
(45) Date of Patent: Jul. 6, 2004

(54) SEMICONDUCTOR DEVICE HAVING DAMASCENE INTERCONNECTION STRUCTURE THAT PREVENTS VOID FORMATION BETWEEN INTERCONNECTIONS

(75) Inventor: Yusuke Harada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/127,599

(22) Filed: Apr. 23, 2002

(65) Prior Publication Data

US 2002/0125579 A1 Sep. 12, 2002

Related U.S. Application Data

(63) Continuation of application No. 09/329,249, filed on Jun. 10, 1999, now Pat. No. 6,400,031.

(30) Foreign Application Priority Data

Jun. 11, 1998 (JP) .......................................... 10-163304

(51) Int. Cl.[7] .............................................. H01L 23/48
(52) U.S. Cl. ....................... 257/752; 257/758; 257/776
(58) Field of Search ................................ 257/776, 748, 257/758, 741, 751, 762, 767, 752, 763, 764, 770, 774, 775; 438/622, 627, 643, 653

(56) References Cited

U.S. PATENT DOCUMENTS

| | | | |
|---|---|---|---|
| 5,391,517 A | 2/1995 | Gelatos et al. | |
| 5,444,022 A | * 8/1995 | Gardner | ....................... 437/195 |
| 5,510,651 A | 4/1996 | Maniar et al. | |
| 5,571,751 A | 11/1996 | Chung | |
| 5,614,764 A | 3/1997 | Baerg et al. | |
| 5,666,007 A | 9/1997 | Chung | |
| 5,674,787 A | 10/1997 | Zhao et al. | |
| 5,691,572 A | 11/1997 | Chung | |
| 5,798,299 A | 8/1998 | Chung | |
| 5,863,835 A | 1/1999 | Yoo et al. | |
| 5,864,179 A | 1/1999 | Koyama | |
| 5,889,328 A | 3/1999 | Joshi et al. | |
| 5,939,788 A | 8/1999 | McTeer | |
| 5,969,422 A | 10/1999 | Ting et al. | |
| 6,008,117 A | 12/1999 | Hong et al. | |
| 6,008,118 A | 12/1999 | Yeh et al. | |
| 6,030,896 A | 2/2000 | Brown | |
| 6,037,250 A | 3/2000 | Matsubara | |
| 6,037,278 A | 3/2000 | Koyanagi et al. | |
| 6,040,627 A | 3/2000 | Harada et al. | |
| 6,077,774 A | 6/2000 | Hong et al. | |

* cited by examiner

*Primary Examiner*—Long Pham
*Assistant Examiner*—Ginette Peralta
(74) *Attorney, Agent, or Firm*—Volentine Francos, P.L.L.C.

(57) ABSTRACT

A semiconductor device includes a first insulating layer having a through hole; a first interconnection having a first conductive layer, a first barrier layer, and a first main interconnection; and a second interconnection connected to one of the first conductive layer and the first barrier layer. Accordingly, a problem wherein copper in the first main interconnection transfers from a connection portion thereof to the second interconnection due to electromigration, so that a void is formed at the connected portion resulting in the first interconnection being disconnected from the second interconnection, can be prevented.

19 Claims, 7 Drawing Sheets

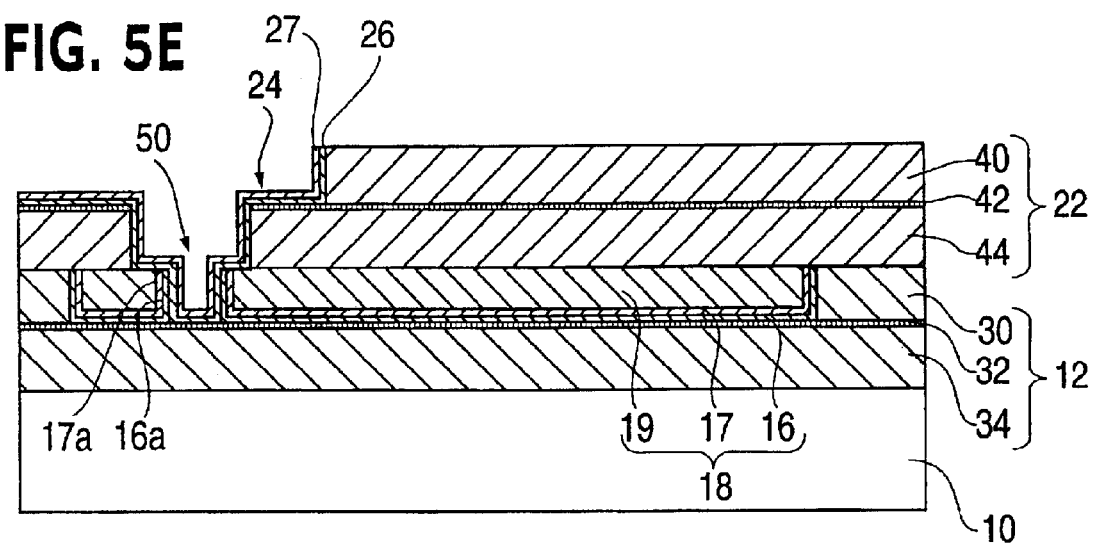
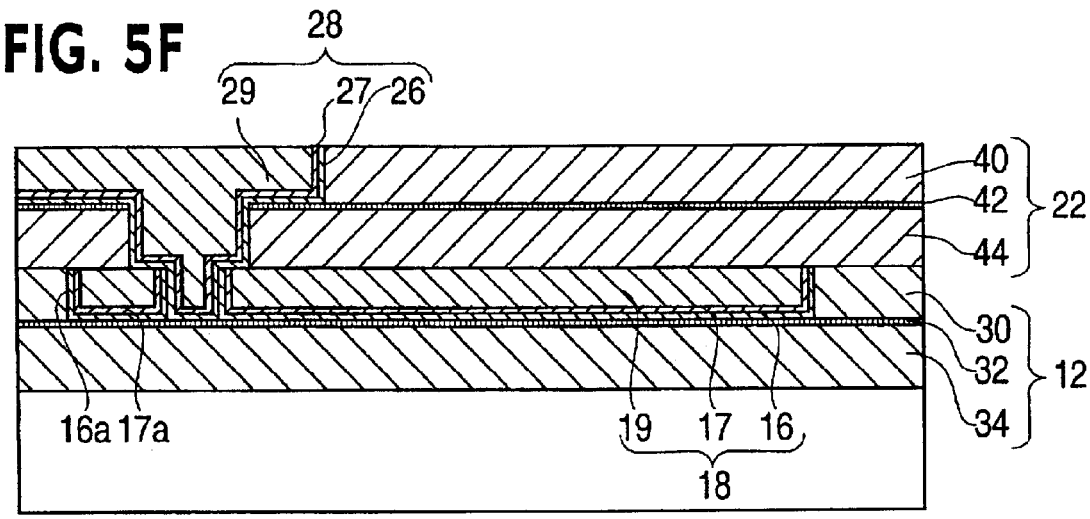

SEMICONDUCTOR DEVICE HAVING DAMASCENE INTERCONNECTION STRUCTURE THAT PREVENTS VOID FORMATION BETWEEN INTERCONNECTIONS

CROSS REFERENCE TO RELATED APPLICATIONS

This is a continuation application of application Ser. No. 09/329,249, filed Jun. 10, 1999, now U.S. Pat. No. 6,400,031, which is hereby incorporated by reference in its entirety for all purposes.

BACKGROUND OF THE INVENTION

1. Field of the Invention

The present invention generally relates to a semiconductor substrate, and more particularly, the present invention relates to a damascene interconnection structure.

This application is a counterpart of Japanese application Serial Number 163304/1998, filed Jun. 11, 1998, the subject matter of which is incorporated herein by reference.

2. Description of the Related Art

In general, it is difficult to form a pattern by etching a Copper (Cu) interconnection. In a formation of the Cu interconnection, an insulating layer such as $SiO_2$ or BPSG is formed on a semiconductor substrate. Then, a recess is formed in the insulating layer so as to shape the Cu interconnection. Then, Cu is buried in the recess. As a result, the Cu interconnection buried in the recess is a so-called damascene interconnection, which is formed on the semiconductor substrate.

Such a damascene interconnection is formed as shown in FIG. 1A–FIG. 1D. FIG. 1A–FIG. 1D are cross sectional views showing a damascene interconnection structure of a conventional art.

A first interconnection pattern recess is formed using photolithography technique and etching technique in a first $SiO_2$ film 12 having a thickness of 1 μm on the semiconductor substrate 10. Then, a barrier layer 16 such as a TiN is formed on the first $SiO_2$ film 12 in the first interconnection pattern recess. Then Cu is formed on the entire surface and the Cu is polished with alkaline solution having a colloidal-silica, so called CMP (chemical mechanical polishing) method. As a result, a first interconnection including a main interconnection 19 which is made up of the Cu, as shown in FIG. 1A. A second SiO2 film 22 having a thickness of 1 μm is formed on the first SiO2 film 12 where the first interconnection 18 was formed. Then, a through hole 55 is formed in the second SiO2 film 22 so that a center portion of an upper surface of the first interconnection 18 is exposed, as shown in FIG. 1B.

A second interconnection pattern recess 24 is formed so that a predetermined portion of the through hole 55 is remained. Then, a barrier layer 26 such as TiN is formed in the remained through hole 55 and the second interconnection pattern recess 24, as shown in FIG. 1C.

Then, Cu is formed on the entire surface using sputtering technique, and the Cu is polished using the CMP method. As a result, a second interconnection 28 including a main interconnection 29 which is made up of the Cu, as shown in FIG. 1D.

In the conventional art of the method for forming the interconnections, it is desirable to avoid a problem wherein the Cu transfers from a portion connected to the second interconnection due to electromigration, whereby a void is formed at the connected portion, and the first interconnection is disconnected from the second interconnection.

SUMMARY OF THE INVENTION

An object of the present invention is to provide a semiconductor device that can avoid the above noted problem so that the Cu transfers from a portion connected to the second interconnection due to electromigration, whereby a void is formed at the connected portion, and the first interconnection is disconnected to the second interconnection.

According to one aspect of the present invention, for achieving the above object, there is provided a semiconductor device comprising: a first insulating layer having a through hole; a first interconnection comprised a first conductive layer, a first barrier layer, and a first main interconnection; the first conductive layer formed on the first insulating layer in the first through hole; the first barrier layer formed on the first conductive layer; the first main interconnection formed on the first barrier layer so as to bury the through hole; and a second interconnection connected to one of the first conductive layer and the first barrier layer.

According to another aspect of the present invention, for achieving the above object, there is provided a semiconductor device comprising: a first insulating layer having a through hole; a first connection comprised of a first conductive layer, a first barrier layer, and a first main interconnection; the first conductive layer formed on the first insulating layer in the first through hole; the first barrier layer formed on the first conductive layer; the first main interconnection formed on the first barrier layer so as to bury the through hole; and a second interconnection connected to one of an edge portion of the first conductive layer exposed from an upper surface of the first insulating layer and an edge portion of the first barrier layer exposed from an upper surface of the first insulating layer.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

FIGS. 5A–5F are cross-sectional views showing a method for forming damascene interconnections structure according to the second preferred embodiment of the present invention.

DETAILED DESCRIPTION OF THE PREFERRED EMBODIMENTS

A storage device and an alternate processing method for defective sectors of a storage device according to first and second preferred embodiments of the present invention will hereinafter be described in detail with reference to the accompanying drawings.

Figure 1A:
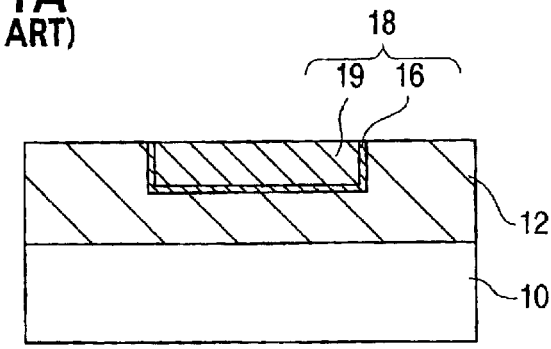
FIG. 1A–FIG. 1D are cross-sectional views showing a damascene interconnection structure of a conventional art.
Figure 1B:
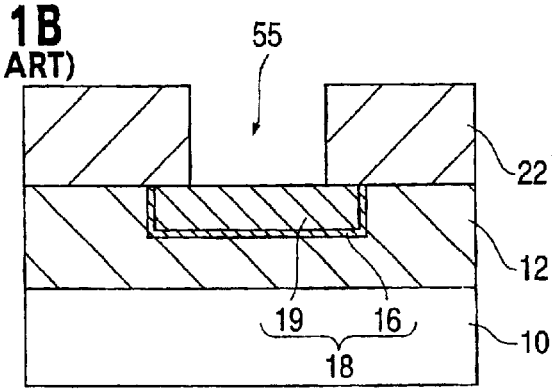
Figure 1C:
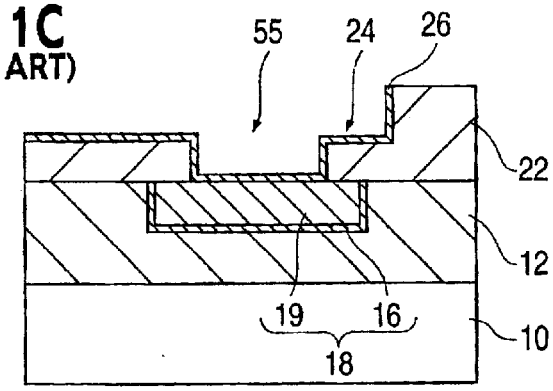
Figure 1D:
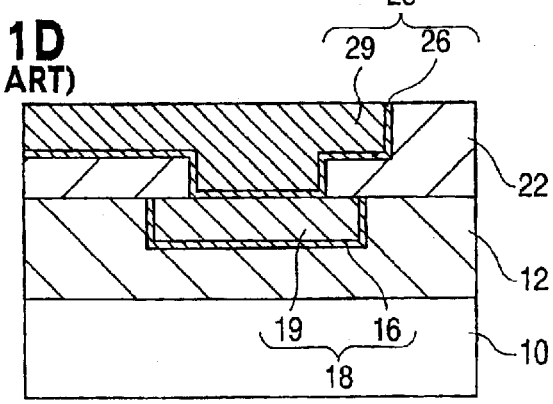
Figure 2:
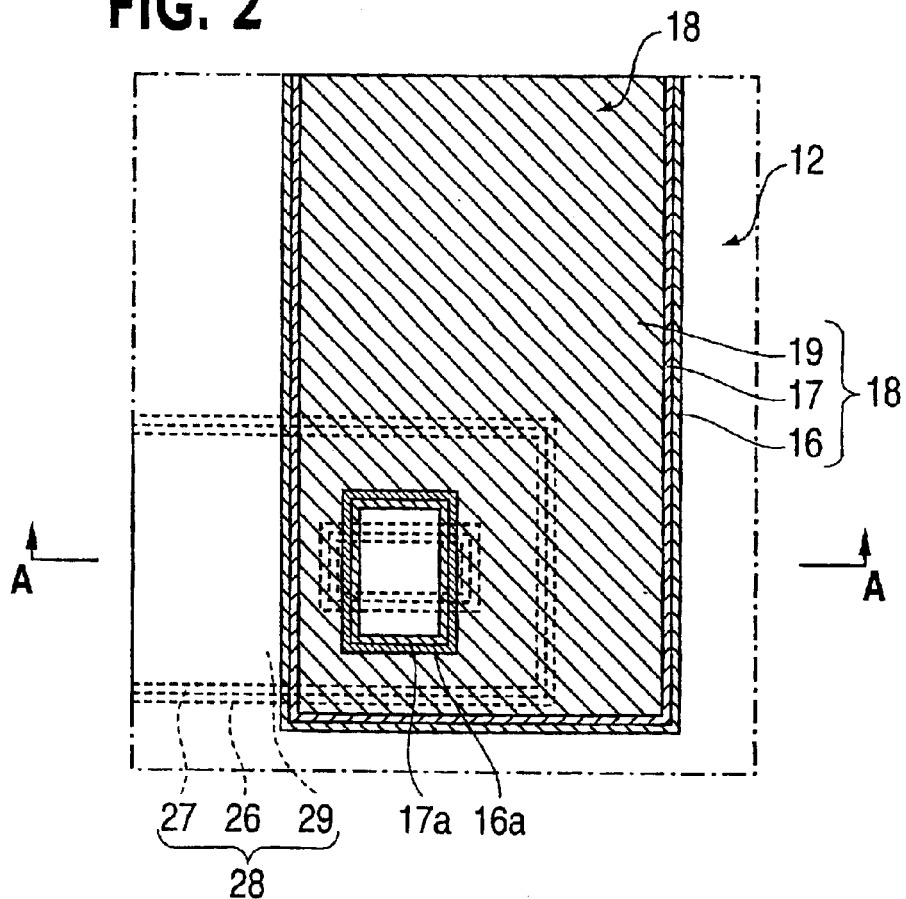
FIG. 2 is a plan-view showing a damascene interconnection structure according to a first preferred embodiment of a present invention.
Figure 3:
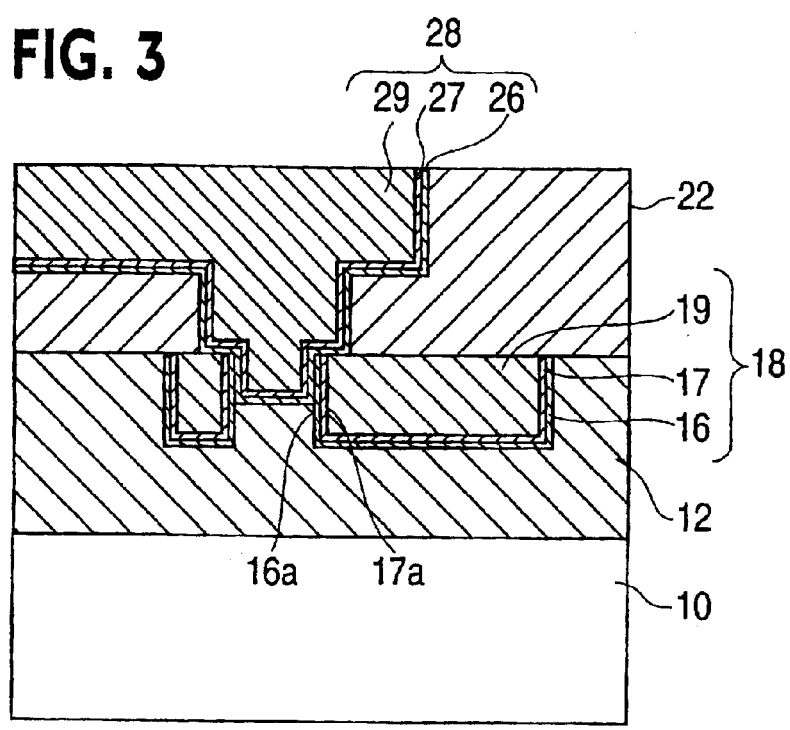
FIG. 3 is a cross-sectional view showing damascene interconnection structure according to the first preferred embodiment of the present invention.

FIG. 2 is a plane-view showing a damascene interconnection structure according to a first preferred embodiment of a present invention. FIG. 3 is a cross-sectional view showing damascene interconnection structure according to the first preferred embodiment of the present invention.

As shown in FIG. 2 and FIG. 3, a first damascene interconnection structure is preferably made up of a first insulating layer, as a first $SiO_2$ 12, having a first through hole, and a first interconnection 18 that is buried in the first through hole. The first interconnection 18 is preferably made up of a first conductive layer such as a first TiN film 16a, a first barrier layer such as a first Ti film 17a, and a first main interconnection 19. The first TiN film 16a is formed on the first $SiO_2$ 12 in the first through hole. The first Ti film 17a is formed on the first TiN film 16a. The first main interconnection is formed on the Ti film 17a so as to bury the first through hole. The first through hole has a first extending direction and a second extending direction which is longer than the first extending direction, and is formed so that the second extending direction corresponds to the flow of electrons in the first interconnection 18 which is formed in the first through hole.

A second damascene interconnection structure is preferably made up of a second insulating layer, as a second $SiO_2$ 22, having a second through hole, and a second interconnection 28 which is buried in the second through hole. The second interconnection 28 is preferably made up of a second conductive layer such as a second TiN film 26, a second barrier layer such as a second Ti film 27, and a second main interconnection 29. The second TiN film 26 is formed on the second $SiO_2$ 22 in the second through hole. The second Ti film 27 is formed on the second TiN film 26. The second main interconnection 29 is formed on the second Ti film 27 so as to bury the second through hole. The second interconnection 28 is connected to one of the first TiN film 16 and the first Ti film 17 of the first interconnection 18. The second interconnection 28 is connected to one of the second TiN film 16a and the second Ti film 17a. The second interconnection 28 has a protrusion portion where the second interconnection 28 is connected to the first interconnection 18. The protrusion portion of the second interconnection 28 is connected to the first interconnection 18 via the first through hole. In the structure mentioned above, when a voltage so as to become a high voltage is applied to the first interconnection 18 and a voltage so as to become a low voltage is applied to the second interconnection 28, electrons flow from the second interconnection 28 to the first interconnection 18. The Cu atoms in the first main interconnection 19 of the first interconnection 18 move to opposite direction of electron flow because of electromigration. As a result, voids are formed in the first main interconnection 19 of the first interconnection 18. However, since the second interconnection is connected to the first Ti 17a, the first Ti 17a can maintain electrical connection between the first and second interconnections.

FIGS. 4A–4F are cross-sectional views showing a method for forming damascene interconnections structure according to the first preferred embodiment of the present invention.

Figure 4A:
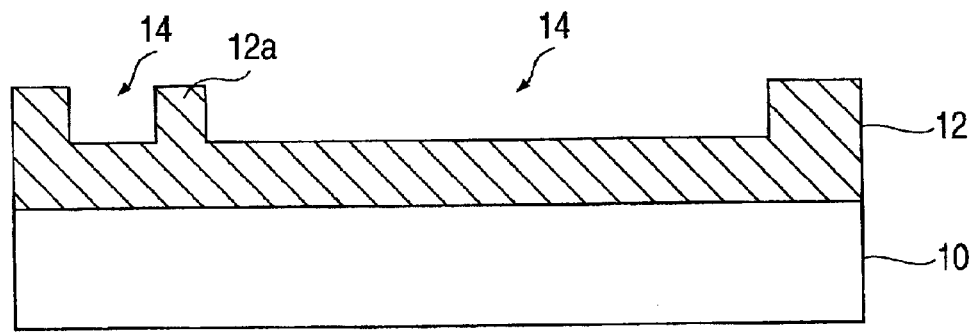
FIGS. 4A–4F are cross-sectional views showing a method for forming damascene interconnections structure according to the first preferred embodiment of the present invention.

As shown in FIG. 4A, a first SiO2 film 12 as a first insulating film, a thickness of 1 µm, is formed on a semiconductor substrate 10. First interconnections recesses 14, a depth of 500 nm, are formed in regions which first interconnections are formed, using photolithography technique and plasma etching with a mixed gas of C2F8 and O2.

Figure 4B:
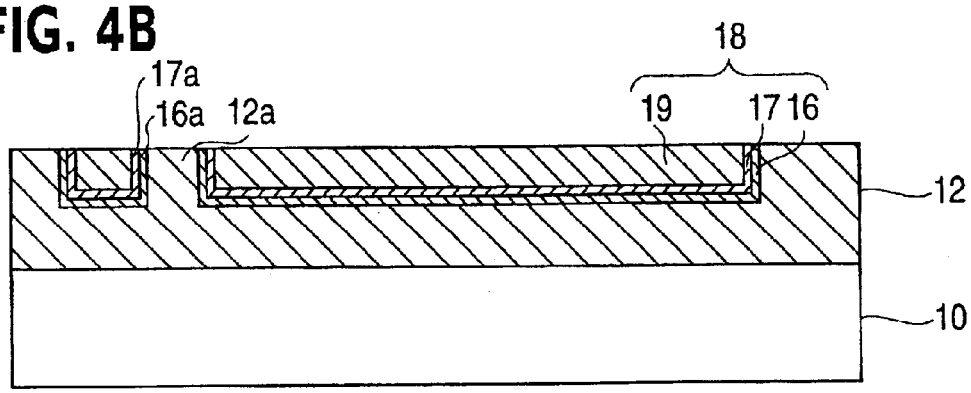

As shown in FIG. 4B, TiN films 16, 16a, a thickness of 30 nm are selectively formed on the first $SiO_2$ film 12 in the first interconnection recesses 14. Ti films 17, 17a, a thickness of 5 nm, are formed on the TiN films 16, 16a. CVD (Chemical Vapor Deposition) method and CMP (Chemical Mechanical Polishing) method are used for forming the TiN films 16, 16a and the Ti films 17, 17a. Then, Cu is buried in the first interconnection recesses 14 and then is polished until the first $SiO_2$ film 12 is exposed, using the CMP method. As a result, a first main interconnection 19 is formed in the first interconnection recesses 14. Therefore, a first interconnection 18 which is made up of the TiN films 16, 16a, the Ti films 17, 17a, and the first main interconnection 19, are formed in the first interconnections recesses 14.

Figure 4C:
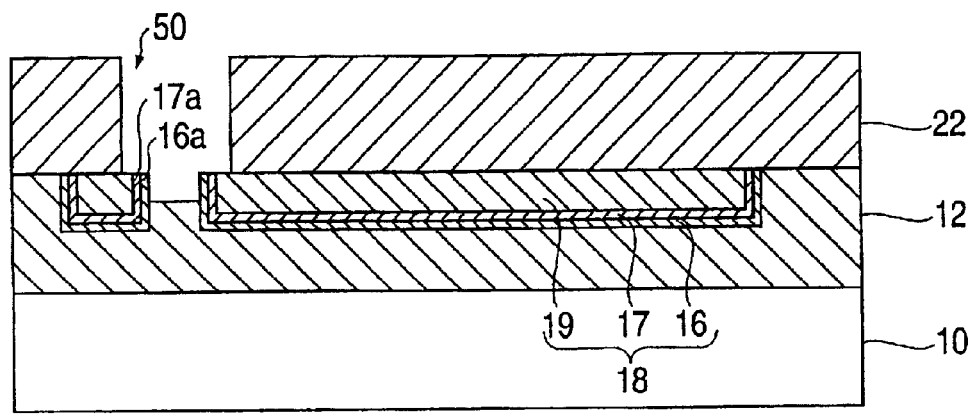

As shown in FIG. 4C, a second $SiO_2$ film as a second insulating film, a thickness of 1 µm, is formed on the entire surface. A first through hole 50 is formed so as to expose the first $SiO_2$ film 12a surface, a portion of the TiN films 16a, and a portion of the Ti films 17a in the second $SiO_2$ film. A portion of the first $SiO_2$ film 12a is removed. As a result, a portion of the TiN films 16a sidewalls is exposed. Here, an etching depth is about the half thickness of the first main interconnection 19.

Figure 4D:
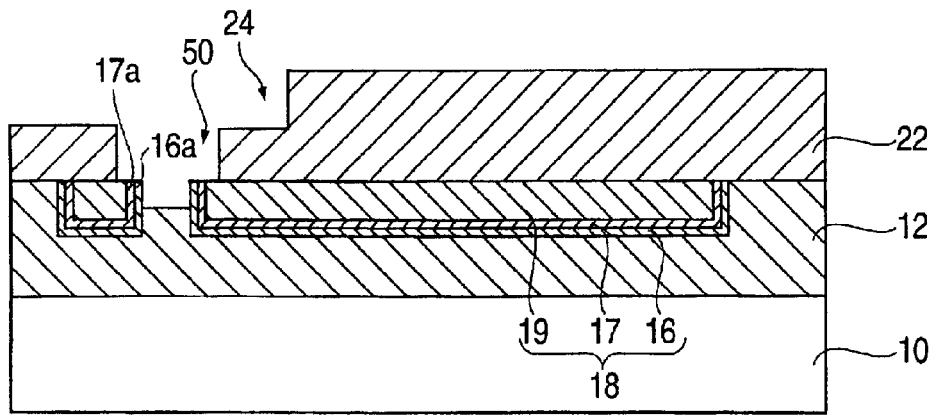

As shown in FIG. 4D, a second interconnection recess 24, a thickness of 500 nm, is formed in the second SiO2 film 22 using plasma etching with C2F8 gas and O2 gas.

Figure 4E:
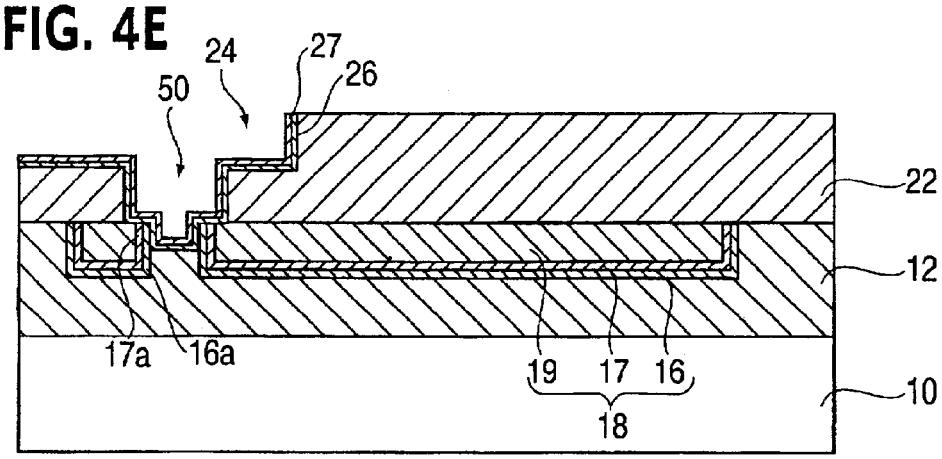

As shown in FIG. 4E, a second TiN film 26 and a second Ti film 27 are successively formed on the second SiO2 film in the second interconnection recess 24 using the same manner of the forming steps for the first interconnection 18.

Figure 4F:
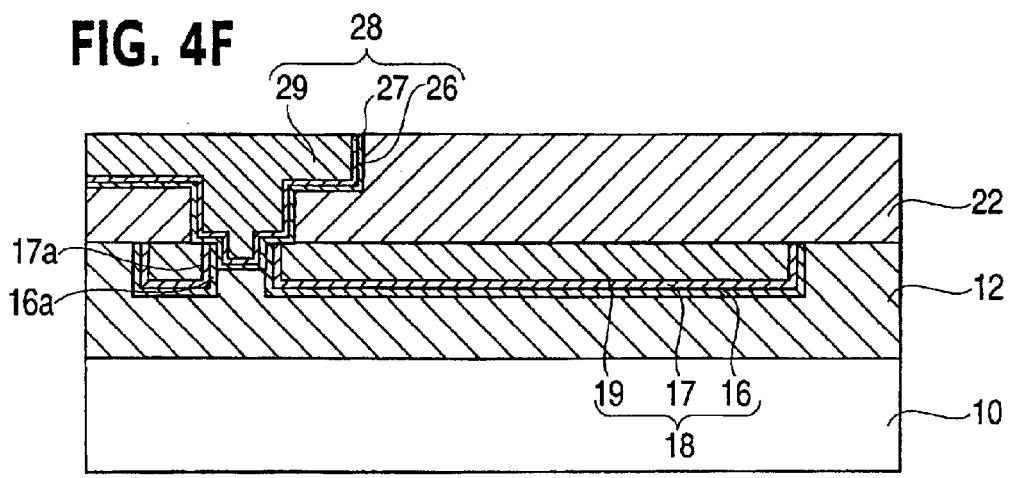

As shown in FIG. 4F, Cu is buried in the second interconnection recess 24 using sputtering method or CVD method. After then, the Cu is polished until the second $SiO_2$ film 22 surface is exposed.

A second interconnection 28 which is made up of the Cu as a second main interconnection, the second TiN film 26, and the second Ti film 27, are formed in the second interconnection recess 24. Thus, the second interconnection 28 is connected to the first TiN film 16a and the first Ti film 17a.

FIGS. 5A–5F are cross-sectional views showing a method for forming damascene interconnection structure according to the second preferred embodiment of the present invention.

Figure 5A:
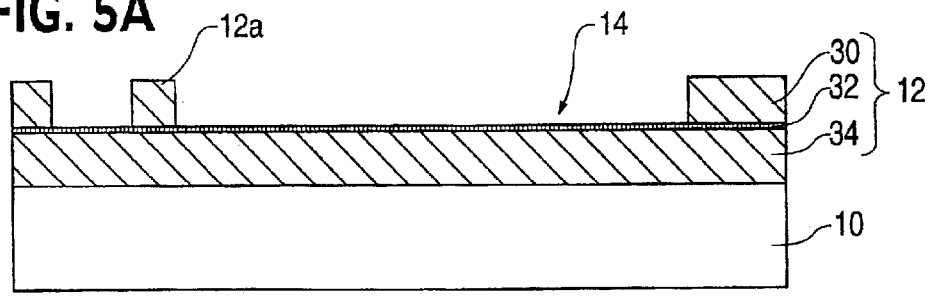

As shown in FIG. 5A, a first insulating film 12 is preferably made up of a SiO2 film 34, a SiN film 32, and a SiO2 film 30. The SiO2 film 34, thickness of 500 nm, is formed on a semiconductor substrate 10. The SiN film 32 as etching stop layer, thickness of 50 nm, is formed on the SiO2 film 34. The SiO2 film 30, thickness of 500 nm, is formed on the SiN film 32.

Then, the SiO2 film 30 is etched using photolithography technique and plasma etching with C2F8 gas and O2 gas. In this time, SiN film 32 serves as the etching stop layer against the SiO2 film 30. As a result, the SiO2 film patterns 12a, 30 and a first interconnection recess 14 are formed, respectively.

Figure 5B:
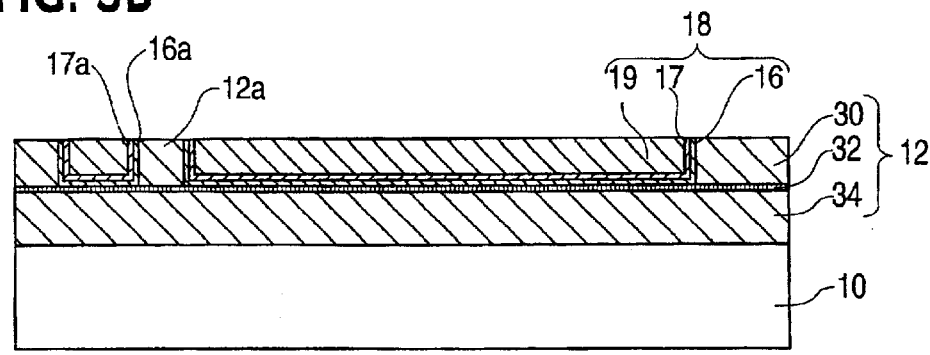

As shown in FIG. 5B, TiN films 16, 16a, Ti films 17, 17a, and first main interconnections 19 are respectively formed in the first interconnection recess 14 using the same manner for forming steps of the first preferred embodiment. Here, a first interconnection 18 is made up of the TiN films 16, 16a, the Ti films 17, 17a, and the first main interconnections 19.

Figure 5C:
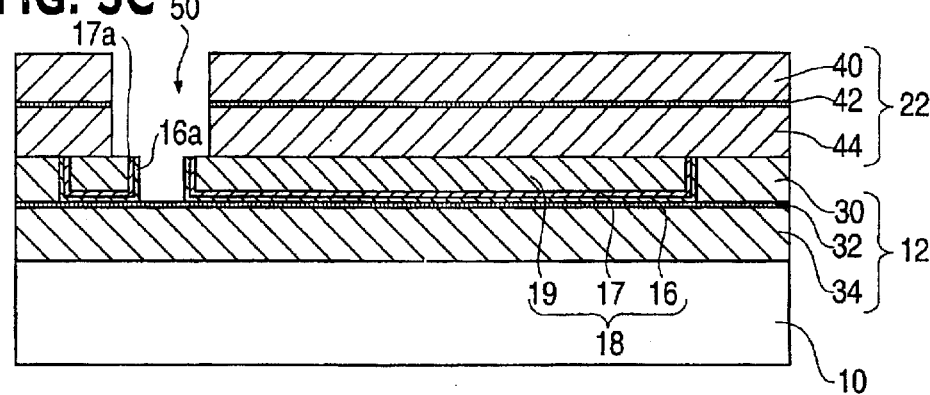

As shown in FIG. 5C, a second insulating film 22 is preferably made up of a SiO2 film 44, a SiN film 42, and a SiO2 film 40. The SiO2 film 44, thickness of 500 nm, is formed on the entire surface. The SiN film 42 as etching stop layer, thickness of 50 nm, is formed on the SiO2 film 44. The SiO2 film 40, thickness of 500 nm, is formed on the SiN film 42.

The $SiO_2$ film 40 is etched using photolithography technique and plasma etching with C2F8 gas and O2 gas until the SiN film 42 is exposed. Then, the SiN film 42 is etched using plasma etching with SF6 gas and O2 gas. Then, the $SiO_2$ films 12, 44 are etched using photolithography technique and plasma etching with C2F8 gas and O2 gas until the SiN film 32 is exposed. As a result, a through hole 50 is formed, and a sidewall of the TiN film 16a, edge of the Ti films 17a, and a part of the first main interconnections 19 are exposed in the through hole 50.

Figure 5D:
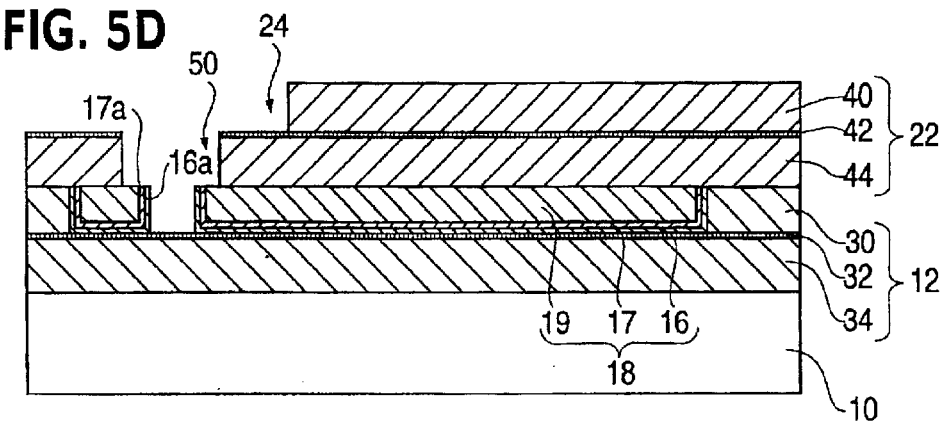

As shown in FIG. 5D, a second interconnection recess 24 which is wider than the through hole 50, is formed by etching the $SiO_2$ film 40 using photolithography technique and plasma etching with C2F8 gas and O2 gas.

As shown in FIG. 5E, a second TiN film 26 and a second Ti film 27 are successively formed in the second interconnection recess 24 and the through hole 50 using the same manner of the forming steps for the first interconnection 18. Here, before forming the second TiN film 26 and the second Ti film 27, another Ti film may be formed in the second interconnection recess 24 and the through hole 50. The first main interconnections 19 are subjected to NH3 used for forming the second TiN film 26. As a result, the first main interconnections 19 nitrides, and it is difficult to electrically connect the first interconnection 18 and the second interconnection 28.

As shown in FIG. 5F, Cu is buried in the second interconnection recess 24 using sputtering method or CVD method. Then, the Cu is polished until the second $SiO_2$ film 22 surface is exposed.

A second interconnection 28 which is made up of the Cu as a second main interconnection, the second Ti film 26, and the second Ti film 27, are formed in the second interconnection recess 24. Thus, the second interconnection 28 is connected to the first TiN film 16a and the first Ti film 17a.

Figure 6:
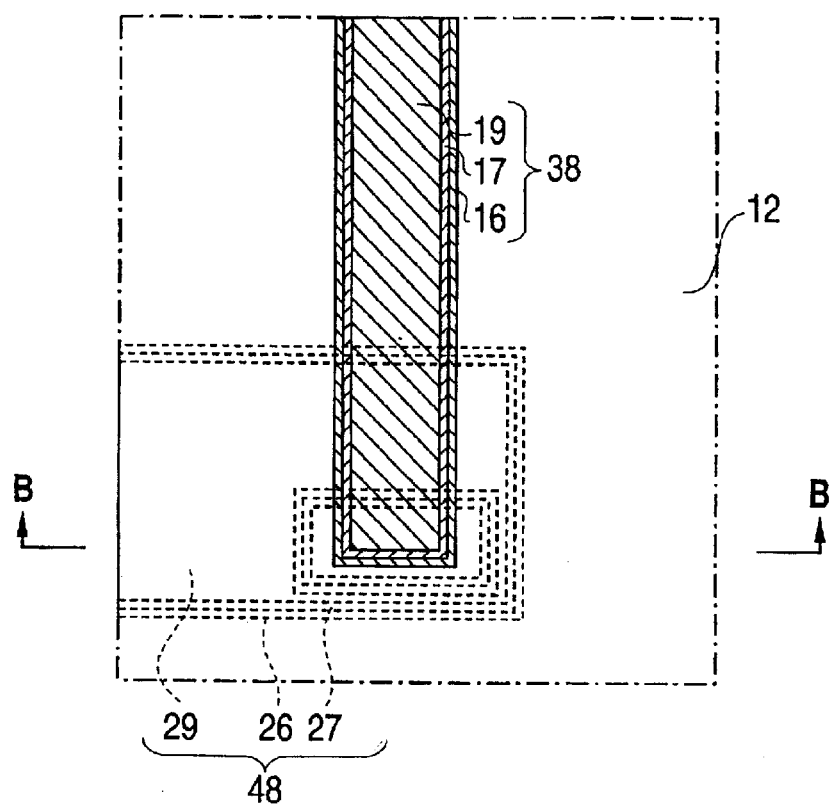
FIG. 6 is a plan-view showing a damascene interconnection structure according to a third preferred embodiment of the invention.
Figure 7:
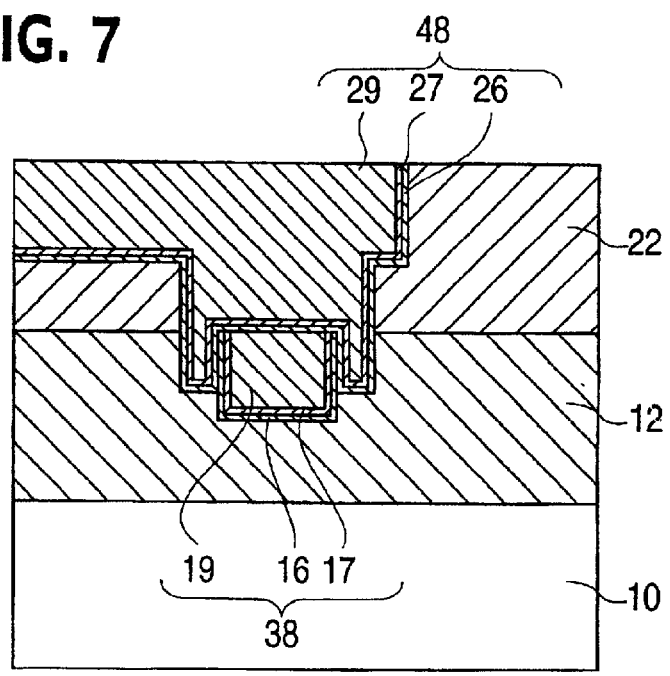
FIG. 7 is a cross-sectional view showing a damascene interconnection structure according to a third preferred embodiment of the invention.

FIG. 6 is a plan-view showing a damascene interconnection structure according to a third preferred embodiment of the invention. FIG. 7 is a cross-sectional view showing a damascene interconnection structure according to a third preferred embodiment of the invention.

As shown in FIG. 6 and FIG. 7, a first interconnection 38 is preferably made up of a TiN film 16 as a barrier layer, a Ti film 17 as a conductive layer, and a first main interconnection 19 comprising Cu. The first interconnection 38 is formed in a first $SiO_2$ film 12. A second interconnection 48 is preferably made up of a TiN film 26 as a barrier layer, a Ti film 27 as a conductive layer, and a first main interconnection 29 comprising Cu.

The second interconnection 48 is formed so as to cover an upper surface of and a sidewall of the first interconnection 38.

Since a connecting area is wider than the conventional art, a contact resistance is low and a current flow is easy. Therefore, it can avoid the electromigration.

In the structure mentioned above, when a voltage so as to become a high voltage is applied to the first interconnection 38 and a voltage so as to become a low voltage is applied to the second interconnection 48, electrons flow from the second interconnection 48 to the first interconnection 38. The Cu atoms in the first main interconnection 19 of the first interconnection 38 move in opposite direction of electron flow because of electromigration. As a result, voids are formed in the first main interconnection 19 of the first interconnection 38. However, since the second interconnection 48 is connected to the first Ti 17a, the first Ti 17a can maintain electrical connection between the first and second interconnections.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
   a first insulating layer;
   a first interconnection formed in a first groove within the first insulating layer, the first interconnection having a hole;
   a second insulating layer formed on the first insulating layer; and
   a second interconnection formed in a second groove and a third groove within the second insulating layer, the second interconnection within the third groove overlapping on an upper surface of the first interconnection and having a convex portion extending from the third groove into the hole of the first interconnection, the convex portion being a same material as the second interconnection,
   the first interconnection being electrically connected to the second interconnection by the convex portion that extends into the hole.

2. The semiconductor device of claim 1, wherein the first interconnection comprises a first conductive layer formed in the first groove, a first barrier layer formed on the first conductive layer, and a first main interconnection formed on the first barrier layer.

3. The semiconductor device of claim 2, wherein the second interconnection comprises a second conductive layer formed in the second and third grooves, a second barrier layer formed on the second conductive layer, and a second main interconnection formed on the second barrier layer.

4. The semiconductor device of claim 3, wherein the second barrier layer comprises TiN and the second conductive layer comprises a barrier metal.

5. The semiconductor device of claim 4, wherein the second main interconnection is copper.

6. The semiconductor device of claim 2, wherein the first barrier layer comprises TiN and the first conductive layer comprises one of a barrier metal and a silicide compound.

7. The semiconductor device of claim 6, wherein the first main interconnection is copper.

8. A semiconductor device comprising:
   a first insulating layer;
   a first interconnection formed in a first groove within the first insulating layer;
   a second insulating layer formed on the first insulating layer; and
   a second interconnection formed in a second groove within the second insulating layer, the second interconnection extending on an upper surface of the first interconnection and into the first insulating layer to first and second outer sidewall surfaces of the first interconnection.

9. The semiconductor device of claim 8, wherein the first interconnection comprises a first conductive layer formed in the first groove, a first barrier layer formed on the first conductive layer, and a first main interconnection formed on the first barrier layer.

10. The semiconductor device of claim 9, wherein the second interconnection comprises a second conductive layer formed in the second groove, a second barrier layer formed on the second conductive layer, and a second main interconnection formed on the second barrier layer.

11. The semiconductor device of claim 10, wherein the second barrier layer comprises TiN and the second conductive layer comprises a barrier metal.

12. The semiconductor device of claim 11, wherein the second main interconnection is copper.

13. The semiconductor device of claim 9, wherein the first barrier layer comprises TiN and the first conductive layer comprises a barrier metal layer.

14. The semiconductor device of claim 13, wherein the first main interconnection is copper.

15. A semiconductive device comprising:

a first insulating layer;

a first interconnection formed in a first groove within the first insulating layer;

a second insulating layer formed on the first insulating layer; and a second interconnection formed in a second groove through the second insulating layer and extending into the first insulating layer, the second interconnection being electrically connected to and in direct contact with an outer side surface and an upper surface of the first interconnection within the first insulating layer.

16. The semiconductor device of claim 15, wherein the second interconnection extends into the first insulating layer at holes along plural side surfaces of the first interconnection.

17. The semiconductor device of claim 15, wherein the first interconnection comprises a first conductive layer formed in the first groove, a first barrier layer formed on the first conductive layer, and a first main interconnection formed on the first barrier layer, and the second interconnection comprises a second conductive layer formed in the second groove, a second barrier layer formed on the second conductive layer, and a second main interconnection formed on the second barrier layer.

18. The semiconductor device of claim 17, wherein the first and second barrier layers comprise TiN, and the first and second conductive layers comprise a barrier metal.

19. The semiconductor device of claim 18, wherein the first and second main interconnections are copper.

* * * * *

UNITED STATES PATENT AND TRADEMARK OFFICE
CERTIFICATE OF CORRECTION

PATENT NO.    : 6,759,747 B2                                                    Page 1 of 1
DATED         : July 6, 2004
INVENTOR(S)   : Yusuke Harada It is certified that error appears in the above-identified patent and that said Letters Patent is hereby corrected as shown below:

Column 7,
Line 21, should read -- The semiconductor device --.

Signed and Sealed this

Twenty-seventh Day of September, 2005

JON W. DUDAS
*Director of the United States Patent and Trademark Office*